(12) United States Patent
Ri

(10) Patent No.: US 9,132,484 B2
(45) Date of Patent: Sep. 15, 2015

(54) CUTTING TOOL

(75) Inventor: Kou Ri, Satsumasendai (JP)

(73) Assignee: KYOCERA CORPORATION, Kyoto (JP)

(*) Notice: Subject to any disclaimer, the term of this patent is extended or adjusted under 35 U.S.C. 154(b) by 18 days.

(21) Appl. No.: 14/342,305

(22) PCT Filed: Jul. 31, 2012

(86) PCT No.: PCT/JP2012/069419
§ 371 (c)(1),
(2), (4) Date: Apr. 28, 2014

(87) PCT Pub. No.: WO2013/031458
PCT Pub. Date: Mar. 7, 2013

(65) Prior Publication Data
US 2014/0227547 A1    Aug. 14, 2014

(30) Foreign Application Priority Data
Aug. 29, 2011 (JP) .................. 2011-186177

(51) Int. Cl.
B23B 27/14 (2006.01)
C23C 16/34 (2006.01)
C23C 16/36 (2006.01)
C23C 16/40 (2006.01)
C23C 28/04 (2006.01)

(52) U.S. Cl.
CPC ............ B23B 27/148 (2013.01); C23C 16/34 (2013.01); C23C 16/36 (2013.01); C23C 16/403 (2013.01); C23C 28/042 (2013.01); C23C 28/044 (2013.01); Y10T 428/12146 (2015.01)

(58) Field of Classification Search
USPC ............ 51/307, 309; 428/336, 697, 698, 699, 428/701, 702
See application file for complete search history.

(56) References Cited

U.S. PATENT DOCUMENTS 8,507,108 B2 * 8/2013 Larsson et al. .................. 51/307
8,580,406 B2 * 11/2013 Yamamoto .................... 428/698

FOREIGN PATENT DOCUMENTS

| EP | 0 558061 | * | 9/1993 |
| JP | 07-173608 | * | 7/1995 |
| JP | 08-118108 | | 5/1996 |
| JP | 4253184 | | 1/2009 |

OTHER PUBLICATIONS

Boxman et al "Structure and hardness of vacuum arc deposited multi-component nitride coatings of Ti,Zr and Nb" Surface & Coatings Tech 125 (2000) p. 257-262.*
Grimberg et al "Multicomponent Ti—Zr_N and Ti—Nb—N coatings deposited by vacuum arc" Surface & Coatings Tech 108-109 (1998) p. 154-159.*
English Translation of International Search Report issued in PCT/JP2012/069419 dated Aug. 24, 2012.

* cited by examiner

Primary Examiner — Archene Turner

(57) ABSTRACT

A cutting tool including a base, a TiN layer on the base, a TiCN layer on the TiN layer, and an $Al_2O_3$ layer on the TiCN layer. The base contains a cemented carbide. The TiN layer and the TiCN layer contain Nb. A Nb content in the TiCN layer at a middle portion of the TiCN layer in a thickness direction is 0.1% by mass or more, and the Nb content in the $Al_2O_3$ layer at a middle portion of the $Al_2O_3$ layer in the thickness direction is 0.05% by mass or less.

6 Claims, 3 Drawing Sheets

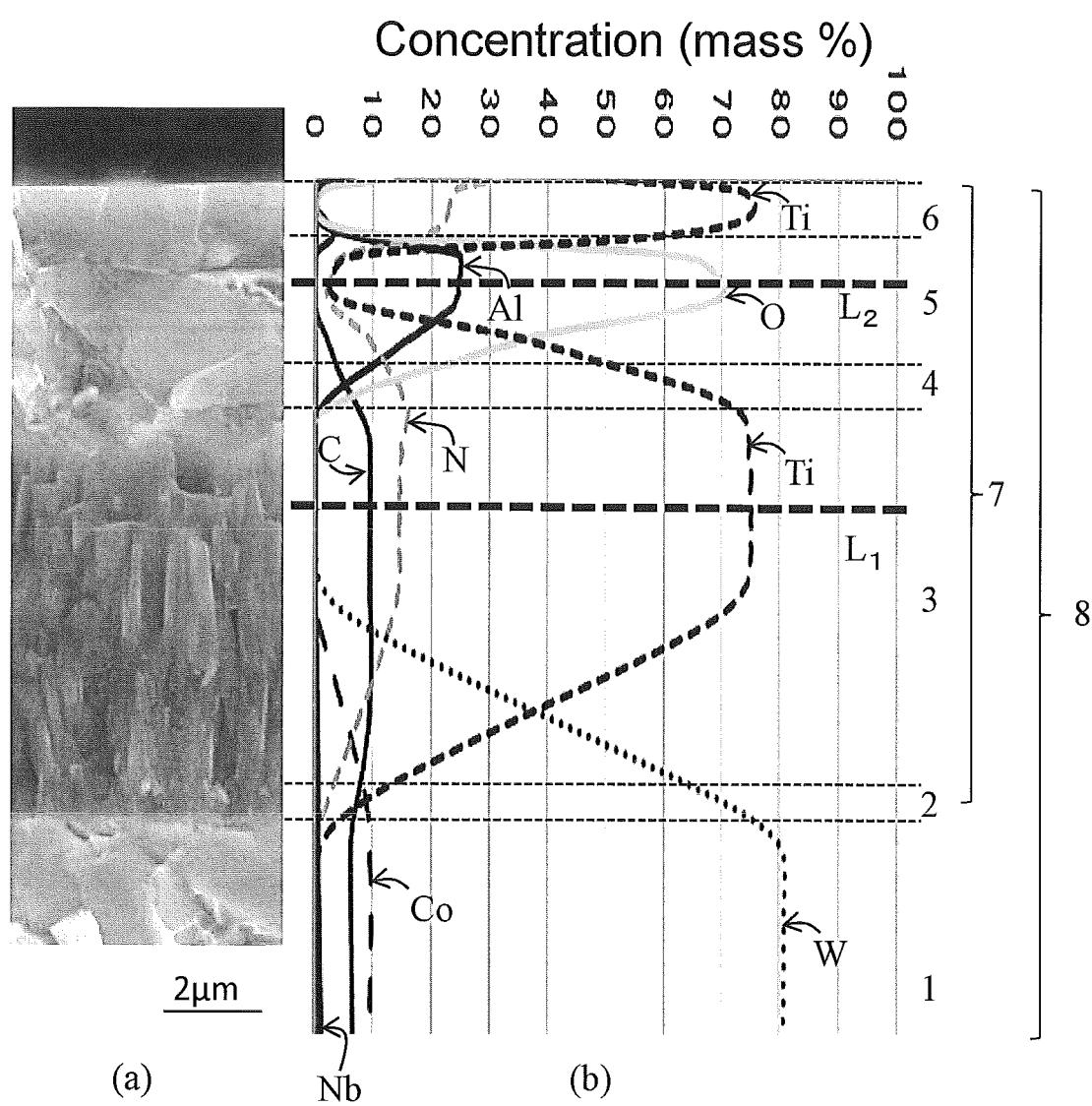

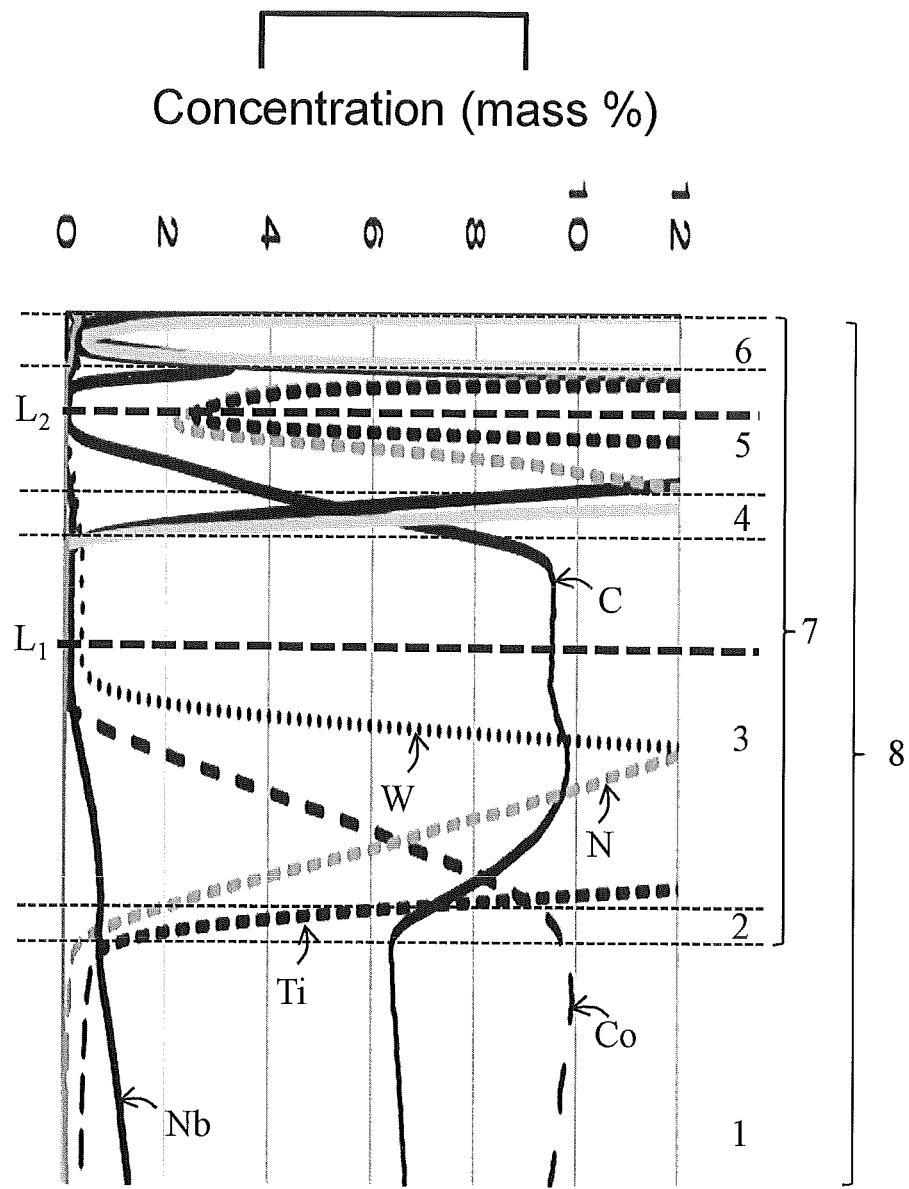

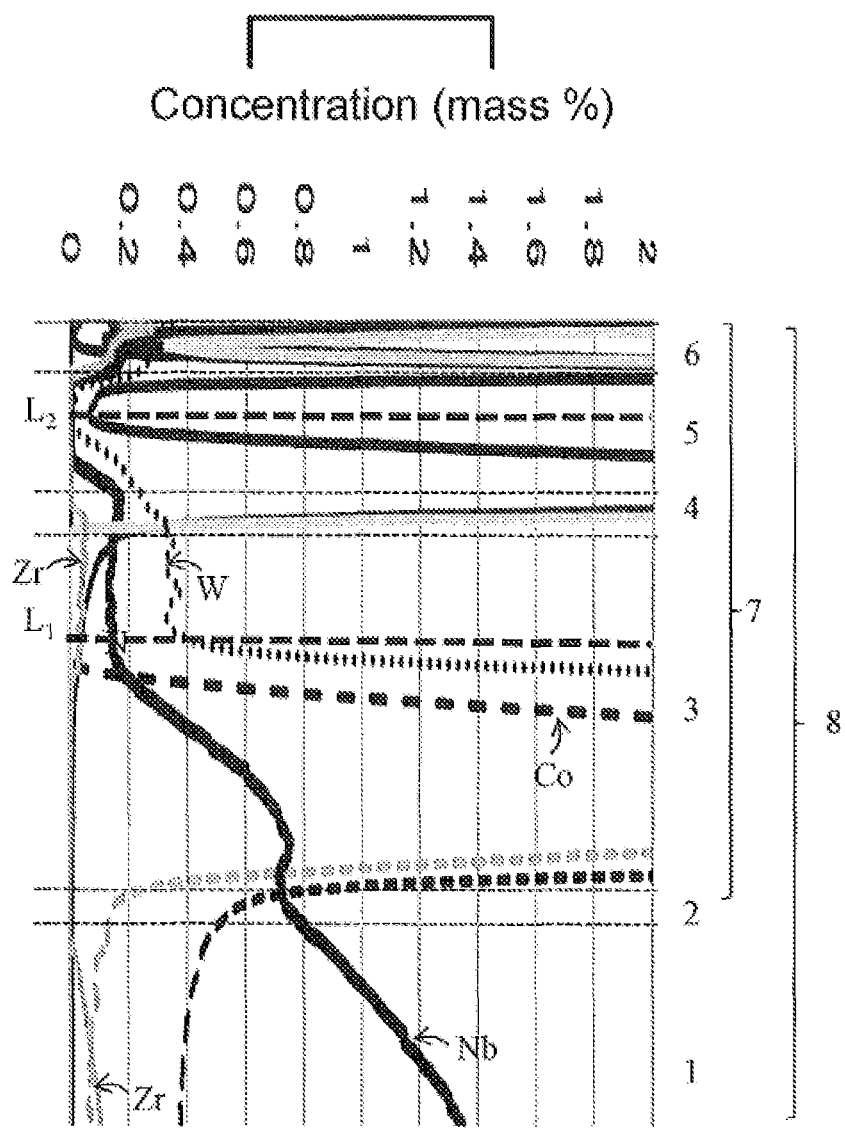

US 9,132,484 B2

CUTTING TOOL

CROSS-REFERENCE TO RELATED APPLICATIONS

This application is a national phase of the International application PCT/JP2012/069419 filed Jul. 31, 2012 that claims priority from the Japanese patent application 2011-186177 filed Aug. 29, 2011. The contents of these aforementioned documents is herewith incorporated by reference.

TECHNICAL FIELD OF THE INVENTION

The present invention relates to cutting tools and, particularly, to a cutting tool including a coating.

BACKGROUND OF THE INVENTION

Cutting tools having been widely used to cut metals are typically covered with a multilayer coating that are formed by depositing a TiCN layer, an $Al_2O_3$ layer and other layers on the surface of a base made of a cemented carbide or the like. Also, it is known that the heat resistance of a cemented carbide is increased by adding a carbide other than WC, such as TIC, TaC, or NbC to a cemented carbide. It is, however, also known that the concentration of carbides other than WC, such as TIC, TaC, and NbC, that is, β phase concentration, is reduced at the surface of the cemented carbide.

Japanese Unexamined Patent Application Publication No. 8-118108 discloses a cutting tool in which the surface of a cemented carbide base is covered with a TiN layer, a TiCN layer, a TiC layer, a TiCNO layer, an $Al_2O_3$ layer and a TiN layer in that order by CVD (chemical vapor deposition). In this disclosure, W and Co are diffused in the grain boundaries of the TiN, TiCN and TiC layers that are closer to the base.

Japanese Patent No. 4253184 discloses a method. For forming a B—C-containing coating, in this method, an amorphous coating of Nb or any other metal is formed by unbalanced magnetron sputtering, and an intermediate layer in which the content of the Nb or any other metal is gradually varied is made by gradually increasing the electric power applied to a target containing B and C while gradually reducing the electric power applied to the Nb or any other metal coating.

The following is a list of the aforementioned background art

PTL 1: Japanese Unexamined Patent Application Publication No. 8-118108
PTL 2: Japanese Patent No. 4253184

Technical Problem

However, in the cutting tool including a coating in which W and Co are diffused as disclosed in Japanese Unexamined Patent Application Publication No. 8-118108, the base and the coating do not have sufficient adhesion therebetween, and accordingly, the coating may be undesirably peeled by an impact of cutting operation. Also, in the cutting tool of Japanese Patent No. 4253184 including a B—C-containing coating whose intermediate layer contains Nb with a content gradually varied, the base and the coating have an insufficient adhesion.

An object of the present invention is to provide a cutting tool exhibiting good wear resistance and fracture resistance, in which the peeling of the coating can be reduced even when work that is likely to apply a strong impact to the cutting edge, such as high-speed work and intermittent cutting work, is performed.

SUMMARY OF THE INVENTION

In the cutting tool of the present invention, a TiN layer, a TiCN layer and an $Al_2O_3$ layer are stacked in this order on a cemented carbide base, and according to glow discharge emission spectrochemical analysis (GDS analysis), the TiN layer and the TiCN layer contain Nb, a Nb content at the middle of the TiCN layer in the thickness direction is 0.1% by mass or more, and the Nb content at the middle of the $Al_2O_3$ layer is 0.05% by mass or less.

According to the cutting tool of the present invention, the TiN and TiCN layers covering the surface of the cemented carbide base contain Nb, and Nb content at the middle of the TiCN layer in the thickness direction is 0.1% by mass or more. This can increase the adhesion between the base and the coating to reduce the peeling of the coating, and increase the wear resistance and fracture resistance of the cutting tool. In addition, since the Nb content at the middle of the $Al_2O_3$ layer is controlled to 0.05% by mass or less, the wear resistance of the cutting tool can be increased.

BRIEF DESCRIPTION OF THE DRAWINGS

FIG. 1 shows together: (a) scanning electron micrograph (SEM); and (b) data of glow discharge emission spectrochemical analysis (GDS analysis), of the cross section, including the surface, of a cutting tool of the present invention.

FIG. 2 is an enlarged view of FIG. 1, showing the distribution of minor constituents in the GDS analysis data.

FIG. 3 is a further enlarged view of FIGS. 1 and 2, showing the distribution of more minor constituents in the GDS analysis data.

DETAILED DESCRIPTION OF THE DRAWINGS

A cutting tool of the present invention will now be described. FIG. 1(a) is a scanning electron micrograph (SEM) of a coating of the cutting tool, and FIG. 1(b) shows results of glow discharge emission spectrochemical analysis (GDS analysis) of the coating in the depth direction from the surface. FIGS. 2 and 3 are enlarged views of FIG. 1, showing the distribution of minor constituents in the GDS analysis data. FIGS. 1 to 3 determine the composition of each layer according to the element distribution and the electron micrograph (SEM). Reference numeral 1 denotes the base (cemented carbide); 2, a TiN layer; 3, a TiCN layer; 4, an intermediate layer containing TiCO, TiNO, TiCNO, TiAlCNO or the like; 5, an $Al_2O_3$ layer; 6, the surface layer that is a TiCN or TiN layer; 7, a coating including layers 2 to 6; and 8, the cutting tool.

GDS analysis can determine the thickness of each layer. However, if the etching rates are varied among the layers, the error of the thickness increases undesirably. In the present invention, accordingly, the boundaries of the layers were determined from the peak shapes of GDS analysis while the compositions of the layers are examined by comparing the scanning electron micrograph (SEM) with electron probe microanalysis (EPMA) data (not shown). The SEM photograph of FIG. 1(a) shows that the TiCN layer 3 is the thickest layer in the coating 7, and that the second thickest is the $Al_2O_3$ layer 5. Also, the GDS analysis data and their peek shapes in FIG. 1(b) suggest the presence of portions in which the Al or Ti distribution is uniform. The mid positions of the middles of the thicknesses of the uniform portions are defined respectively as middle $L_1$ of the TiCN layer and middle $L_2$ of the $Al_2O_3$ layer.

Preferably, the base 1 includes a WC phase, a binder phase, a B1 solid solution phase, and contains 80% to 94% by mass of WC, 5% to 15% by mass of Co, 0.1% to 10% by mass of Nb in terms of NbC, and 0% to 10% by mass of at least one compound selected from the group consisting of carbides (other than WC), nitrides and carbonitrides of groups 4, 5 and 6 elements. The base 1 includes a WC phase, a B1 solid solution phase containing Nb, and a binder phase mainly containing the Co. The Nb content in the base 1 is desirably 1% to 8% by mass, preferably 1% to 5% by mass, in terms of NbC.

In the present embodiment, the base 1 has an inner region in which the Nb content is constant and a surface region in which the Nb content is lower than the inner region. In the base 1 of the present embodiment, the Nb content at a mid-position of the depth of the surface region, at a depth of 5 to 40 μm from the surface of the surface region, is controlled to 0.8 or less, desirably 0.2 to 0.8, relative to the Nb content in the inner region at a depth of 1000 μm or more from the surface of the base 1. Thus the Nb distribution in the coating 7 can be easily controlled in a predetermined range. The inner region of the base 1 mentioned herein refers to the region lying deeper than the surface region of the base 1, and the composition of the interior is measured at a depth of 1000 μm or more. In the surface region, the Co content tends to increase.

The base 1 is provided with a coating including a TiN layer 2, a TiCN layer 3, and an $Al_2O_3$ layer 5, in that order, on the surface thereof. The coating may further include another layer between any two layers of the TiN layer 2, the TiCN layer 3 and the $Al_2O_3$ layer 5. For example, the coating preferably includes an intermediate layer 4 containing oxygen, such as a TiCNO layer, a TiCO layer, a TiNO layer, or a TiAlCNO layer, between the TiCN layer 3 and the $Al_2O_3$ layer 5. This structure allows the $Al_2O_3$ layer 5 to be easily controlled to an α crystal structure. Furthermore, a surface layer 6 defined by a TiCN layer, a TiN layer or the like may be formed on the surface of the $Al_2O_3$ layer 5.

In FIG. 3, the TiN layer 2 and the TiCN layer 3 contain Nb, and the Nb content at the middle of the $Al_2O_3$ layer 5 is 0.05% by mass or less. This increases the adhesion between the base 1 and the coating 7, so that the peeling of the coating 7 can be reduced even when work that is likely to apply a strong impact to the cutting edge, such as high-speed work and intermittent cutting work, is performed. Thus, the wear resistance and fracture resistance of the cutting tool 8 can be increased. In other words, when the Nb content at the middle (denoted by $L_1$ in FIGS. 1 to 3) of the TiCN layer 3 is 0.1% to 0.4% by mass in GDS analysis, the wear resistance of the TiCN layer 3 can be increased as well as the adhesion between the base 1 and the coating 7. In addition, when the Nb content at the middle (denoted by $L_2$ in FIGS. 1 to 3) of the $Al_2O_3$ layer 5 layer is 0.05% by mass or less, the $Al_2O_3$ layer 5 exhibits high resistance to oxidation, and the cutting tool 8 has high wear resistance, accordingly.

The coating 7, from the TiN layer 2 to the TiCN layer 3, desirably contains W and Co in addition to Nb. From the view point of increasing the adhesion between the base 1 and the coating 7 in FIG. 3, it is desirable that the W content at middle $L_1$ in the TiCN layer 3 be 0.2% to 1.0% by mass, and that the Co content at middle $L_1$ in the TiCN layer 3 be 0.01% to 0.08% by mass. Also, FIG. 3 shows that Zr is diffused in the coating 7 with a unique behavior such that the TiN layer 2 does not contain Zr component, while the Zr content increases in the TiCN layer 3 at the interface thereof with the intermediate layer 4.

In addition, from the viewpoint of optimizing the resistance to plastic deformation, it is desirable that GDS analysis show the base 1 includes a smaller amount of a B1 solid solution phase at the surface thereof and contain a smaller amount of Nb at the surface thereof in a proportion of 0.8 or less to the interior of the base made of a cemented carbide, and that the interior of the base 1 includes a B1 solid solution phase with a Nb content of 1% to 8% by mass, preferably 1% to 5% by mass, in terms of NbC. Desirably, the Nb content in GDS analysis at the surface of the base 1 is less than 1%, preferably 0.08% to 0.3% by mass. The interior of the base 1 mentioned herein refers to a position at 1000 μm from the surface of the cemented carbide 1.

In the GDS analysis results shown in FIG. 2, it is desirable that the distribution of C (carbon) be such that the C concentration is constant and within the range of ±0.5% by mass in the region of the TiCN layer 3 close to the $Al_2O_3$ layer 5, then increases once from that region toward the TiN layer 2, and decreases. This can increase the fracture resistance of the TiCN layer 3, as well as increasing the adhesion of the TiCN layer 3.

Desirably, the TiN layer 2 has a thickness of 0.2 to 0.6 μm from the viewpoint of controlling the Nb content.

(Manufacturing Method)

A method for producing a cemented carbide used in the cutting tool of the present invention will now be described by way of example. First, 80% to 94% by mass of WC powder, 5% to 15% by mass of metallic Co powder, 0.1% to 10% by mass of NbC powder as a compound powder for forming a B1 solid solution phase, and 10% by mass or less of another compound powder for forming the B1 solid solution phase are mixed together. At this time, these powders are adjusted to an average particle size of 0.5 to 2 μm for the compound powder or NbC powder for forming the B1 solid solution phase, an average particle size of 0.5 to 10 μm for the WC powder, and an average particle size of 1.0 to 2.0 μm for the metallic Co powder, and the cemented carbide for the cutting tool of the present invention can be produced through the following steps of mixing and firing.

After adding a solvent to the prepared powder, followed by mixing and pulvering for a predetermined time, a slurry is formed. Then, a binder is mixed to the slurry, and while the slurry is dried into mixed powder with a spray drier or the like, the mixed powder is granulated. Subsequently, the granulated powder is formed into a shape of a cutting tool by press forming. Then, a solution containing NbC or metallic niobium (Nb) is prepared, and the surface of the cemented carbide base is impregnated with Nb to increase the Nb concentration by spraying method, impregnation method, or application method. Furthermore, after being degreased in a firing furnace, a cemented carbide can be produced by firing at a reduced pressure of 20 to 2000 Pa for 1 to 1.5 hours in the furnace whose temperature is increased to 1380 to 1480° C.

The resulting cemented carbide may be subjected to surface polishing or honed into a cutting edge, if necessary.

Subsequently, a coating 2 is formed over the surface of the resulting base by chemical vapor deposition (CVD). The deposition conditions will be described by way of example. First, a TiN (titanium nitride) layer is formed directly on the base as required. Desirably, the TiN layer is formed under the conditions using a mixed gas containing 0.5% to 10% by volume of titanium tetrachloride ($TiCl_4$) gas, 10% to 60% by volume of nitrogen ($N_2$) gas, and the balance of hydrogen ($H_2$) gas at a temperature of 800 to 940° C. and a pressure of 8 to 50 kPa.

Subsequently, a TiCN layer is formed over the TiN layer. This formation is performed under the condition using a mixed gas containing 0.5% to 10% by volume of titanium tetrachloride ($TiCl_4$) gas, 1% to 60% by volume of nitrogen ($N_2$) gas, 0.1% to 3.0% by volume of acetonitrile ($CH_3CN$) gas, and the balance of hydrogen ($H_2$) gas at a coating temperature of 780 to 850° C. and a pressure of 5 to 25 kPa. Thus, an MT (Moderate Temperature)-TiCN layer made of so-called columnar crystals is formed. Subsequently, a HT (High Temperature)-TiCN layer made of so-called granular crystals is formed over the MT-TiCN layer. More specifically, the HT-TiCN layer is formed subsequent to the formation of the TiCN layer under the conditions using a mixed gas containing 0.1% to 3% by volume of titanium tetrachloride ($TiCl_4$) gas, 0% to 15% by volume of nitrogen ($N_2$) gas, 0.1% to 10% by volume of methane ($CH_4$) gas or acetonitrile ($CH_3CN$) gas, and the balance of hydrogen ($H_2$) gas at a temperature of 900 to 1020° C. and a pressure of 5 to 40 kPa Subsequently, a TiAlCNO layer is formed under the conditions using a mixed gas containing 0.1% to 3% by volume of titanium tetrachloride ($TiCl_4$) gas, 1% to 15% by volume of nitrogen ($N_2$) gas, 0.1% to 10% by volume of methane ($CH_4$) gas or acetonitrile ($CH_3CN$) gas, 0.5% to 3.0% by volume of carbon monoxide (CO) gas, 0.5% to 3.0% by volume of aluminum trichloride ($AlCl_3$), and the balance of hydrogen ($H_2$) gas at a temperature of 900 to 1020° C. and a pressure of 5 to 40 kPa.

Continuously, an $\alpha$-$Al_2O_3$ layer is formed. As for a specific example, the formation of this layer is performed under the conditions using a mixed gas containing 0.5% to 5.0% by volume of aluminum trichloride ($AlCl_3$), 0.5% to 3.5% by volume of hydrogen chloride (HCl) gas, 0.5% to 5.0% by volume of carbon dioxide ($CO_2$) gas, 0% to 0.5% by volume of hydrogen sulfide ($H_2S$) gas and the balance of hydrogen ($H_2$) gas at a temperature of 930 to 1010° C. and a pressure of 5 to 10 kPa.

Subsequently, a TiN layer is formed on the surface of the $Al_2O_3$ layer as required. Desirably, this TiN layer is formed under the conditions using a mixed gas containing 0.1% to 10% by volume of titanium tetrachloride ($TiCl_4$) gas, 1% to 60% by volume of nitrogen ($N_2$) gas, and the balance of hydrogen ($H_2$) gas at a temperature of 855 to 1010° C. and a pressure of 10 to 85 kPa.

After the formation of the coating, Nb present at the surface of the base is diffused into the coating so as to have a predetermined content by keeping in the deposition chamber at a pressure of 350 kPa to 850kPa and a temperature of 1000 to 1200° C. for 30 minutes to 120 minutes and then cooling in the chamber.

Then, the resulting coating is polished at least at the cutting edge of the surface thereof, if necessary. This polishing operation makes the cutting edge smooth and prevents the adhesion of a work material. Consequently, the resulting cutting tool exhibits good fracture resistance.

EXAMPLES

Example 1

To WC powder having an average particle size of 5 µm were added 8% by mass of metallic Co powder having an average particle size of 1.5 µm, 0.8% by mass of TiC powder having an average particle size of 1.0 µm, 3.5% by mass of NbC powder having an average particle sized of 1.0 µm, and 0.3% by mass of ZrC powder having an average particle size of 2.0 µm. After these materials were mixed with an organic solvent and pulverized, a shape retention agent was added to the mixture to yield a slurry. The slurry was granulated in a spray drier. Subsequently, the granulated powder was formed into the shape of a cutting tool (CNMG120408PS) by press forming. The shaped material was degreased at 450° C. for 3 hours in a firing furnace, and then sintered at 1450° C. for one hour to yield cemented carbide. The resulting cemented carbide base was subjected to electron probe microanalysis (EPMA) with a scanning electron microscope (SEM), and the results showed that a surface region had been formed with a thickness of 30 µm from the surface. It was also found from the same analysis that the Nb content at the middle of the surface region in the depth direction was 0.65 relative to the Nb content of the interior at the depth of 1000 µm or more from the surface of the cemented carbide base.

The cemented carbide was cut into a substantially flat shape of CNMG120408PS, and then the surface of the base was honed into a cutting edge. Then, the Nb content of the surface of the base was increased using a slurry containing NbC by the method shown in Table 1.

Then, layers of the coating shown in Table 1 were formed on the surface of the worked cemented carbide by chemical vapor deposition (CVD). After the deposition, the sample was subjected to the step of being allowed to stand at a high temperature shown in Table 1 for 60 minutes in a chamber controlled to 500 kPa, followed by cooling the interior of the chamber. In the Example, the thickness of each layer was measured by observing the section of the coating through a scanning electron microscope.

TABLE 1

| | base | Temperature after | Coating (composition: thickness (µm)), composition at middle (element present (content (mass %))) | | | | | |
|---|---|---|---|---|---|---|---|---|
| Sample No. | surface treatment | deposition (° C.) | TiN layer | TiCN layer | Middle $L_1$ composition | Intermediate layer | $Al_2O_3$ layer | Middle $L_2$ composition | Surface layer |
| 1 | Spray | 1000 | TiN: 0.2 | TiCN: 10 | Ti(75.40), Nb(0.10) W(0.46), Co(0.02) N(14.82), C(9.20) | TiCNO: 0.5 | $\alpha$-$Al_2O_3$ layer: 3 | Al(24.94), Nb(0.02) W(0.01), Co(0.01) N(2.42), C(0.07) O(72.53) | TiCN: 0.5 TiN: 0.5 |
| 2 | Application | 1100 | TiN: 0.6 | TiCN: 8 | Ti(75.90), Nb(0.22) W(0.20), Co(0.01) N(14.63), C(9.04) | TiNO: 1 | $\alpha$-$Al_2O_3$ layer: 3.5 | Al(25.32), Nb(0.01) W(0.02) N(2.84), C(0.08) O(71.73) | TiN: 0.5 |
| 3 | Spray | 1200 | TiN: 0.5 | TiCN: 12 | Ti(75.10), Nb(0.40) W(1.04), Co(0.06) N(15.60), C(7.80) | TiCO: 0.3 | $\alpha$-$Al_2O_3$ layer: 2.5 | Al(24.71), Nb(0.05) W(0.03) N(3.22), C(0.08) O(71.91) | — |

TABLE 1-continued

| Sample No. | base surface treatment | Temperature after deposition (°C.) | TiN layer | TiCN layer | Middle $L_1$ composition | Intermediate layer | $Al_2O_3$ layer | Middle $L_2$ composition | Surface layer |
|---|---|---|---|---|---|---|---|---|---|
| 4 | Immersion | 1100 | TiN: 0.5 | TiCN: 8 | Ti(75.80), Nb(0.28), W(0.31), Co(0.01), N(14.20), C(9.40) | — | K-$Al_2O_3$ layer: 3 | Al(23.14), Nb(0.01), W(0.02), Co(0.01), N(3.82), C(0.18), O(72.82) | TiCN: 0.5 |
| 5 | Spray | 900 | — | TiCN: 10 | Ti(75.14), Nb(0.08), W(0.21), N(16.13), C(8.44) | TiCNO: 0.5 | α-$Al_2O_3$ layer: 3 | Al(24.90), Nb(0.01), W(0.01), N(2.09), C(0.07), O(72.92) | TiCN: 0.5 |
| 6 | — | 1100 | TiN: 0.5 | TiCN: 10 | Ti(75.90), Nb(0.08), W(0.32), Co(0.03), N(15.17), C(8.50) | TiNO: 0.3 | α-$Al_2O_3$ layer: 3 | Al(25.81), Nb(0.01), W(0.01), N(2.63), C(0.07), O(71.47) | TiCN: 0.5 |
| 7 | Application | 1250 | TiN: 0.5 | TiCN: 10 | Ti(74.24), Nb(0.42), W(0.48), Co(0.12), N(15.60), C(9.14) | TiCNO: 0.2 | α-$Al_2O_3$ layer: 3 | Al(25.12), Nb(0.10), W(0.04), Co(0.02), N(2.53), C(0.08), O(72.11) | TiN: 0.5 |
| 8 | Spray | — | TiN: 0.5 | TiCN: 10 | Ti(74.53), Nb(0.05), W(0.35), Co(0.02), N(16.12), C(8.93) | TiCNO: 0.3 | α-$Al_2O_3$ layer: 3 | Al(26.04), W(0.01), Co(0.01), N(2.84), C(0.07), O(71.03) | TiN: 0.5 |

The composition distribution of the resulting cutting tool in the depth direction from the surface was examined by GDS analysis (GD-PROFTLER manufactured by Horiba, conditions: power of 20 W, Ar pressure of 600 Pa, discharge range of 2 mm in diameter, sampling time of 0.3 sec/point). The distribution of the elements at the middles of the TiCN and $Al_2O_3$ layers and the concentrations of the elements are shown in Table 1. Also, the cross section of the cutting tool was observed with an SEM.

Then, the cutting tool was subjected to continuous cutting test and strong intermittent cutting test under the following conditions for evaluating wear resistance and fracture resistance.

(Wear Test Conditions)

Material to be cut: SCM435

Shape of cutting tool: CNMG120408PS

Cutting speed: 300 m/min

Feed speed: 0.3 mm/rev

Nick: 2.0 mm (shifted every 3-second cutting operation)

Cutting time: 15 minutes

Cutting liquid: mixture of 15% of emulsion+85% of water

Test items: measuring the amount of flank wear and the amount of nose wear by observing the cutting edge through a microscope (Strong Intermittent Cutting Conditions)

Material to be cut: SCM440, material with 4 grooves

Shape of cutting tool: CNMG120408PS

Cutting speed: 300 m/min

Feed speed: 0.35 mm/rev

Nick: 1.5 mm

Cutting liquid: mixture of 15% of emulsion+85% of water

Test item: number of impacts until fracture occurred

When the number of impacts reached 1000 times, the cutting edge was observed through a microscope.

The results are shown in Table 2.

TABLE 2

| | Wear test | | Strong intermittent test | |
|---|---|---|---|---|
| Sample No. | Flank wear (mm) | Edge condition | Number of impacts (times) | Edge condition |
| 1 | 0.12 | Normal | 1850 | Normal |
| 2 | 0.11 | Normal | 2015 | Normal |
| 3 | 0.08 | Normal | 1802 | Normal |
| 4 | 0.16 | Worn | 1768 | Normal |
| 5 | 0.26 | Largely worn | 1879 | Coating peeled |
| 6 | 0.15 | Coating peeled | 1560 | Coating peeled |
| 7 | 0.32 | Largely worn | 1750 | Largely worn |
| 8 | 0.28 | Largely worn | 1780 | Largely worn |

According to the results shown in Tables 1 and 2, the coatings of Sample No. 5, in which a TiN layer was not formed on the surface of the base, and Sample Nos. 6 and 8, in which the Nb content at the middle of the TiCN layer was less than 0.1% by mass, were peeled from the base, and the results of the wear test and strong intermittent test were poor in these samples. In Sample No. 7, in which the Nb content at the middle of the $Al_2O_3$ layer exceeded 0.05% by mass, the wear resistance of the coating was reduced.

On the other hand, Samples 1 to 4, each of which included a TiN, a TiCN and an $Al_2O_3$ layer deposited in that order, and whose GDS analysis results showed that the Nb content at the middle of the TiCN layer was 0.1% by mass or more and that the Nb content at the middle of the $Al_2O_3$ layer was 0.05% by mass or less, each exhibited high adhesion of the coating and good cutting performance with high wear resistance and fracture resistance. In each of Sample Nos. 1 to 4, the Nb content at the vicinity of the surface of the base was reduced to 0.8 or less relative to that in the interior of the base, as shown in FIGS. 2 and 3.

Example 2

Samples shown in Table 3 were prepared under the same conditions as in Example 1, except that the composition of the cemented carbide base of Sample No. 3 in Example 1 was varied to the composition shown in Table 3. The results are shown in Tables 3 and 4.

TABLE 3

| Sample No. | Cemented carbide composition (mass %) | | | | | | Surface region | | Element present in each layer Content (mass %) | |
|---|---|---|---|---|---|---|---|---|---|---|
| | WC | Co | NbC | TiC | TaC | ZrC | Thickness (μm) | Nb content | Composition at middle of TiCN layer | Composition at middle of Al₂O₃ layer |
| 9 | 82.0 | 9.0 | 5.3 | 2.2 | 1.5 | 0.0 | 50.0 | 0.2 | Ti(75.20), Nb(0.58) W(0.38), Co(0.04) N(14.18), C(9.62) | Al(24.94), Nb(0.05) W(0.01), Co(0.03) N(2.45), C(0.07) O(72.45) |
| 10 | 88.8 | 7.5 | 1.2 | 0.0 | 2.0 | 0.5 | 15.0 | 0.7 | Ti(75.21), Nb(0.13) W(0.24), Co(0.03) N(14.79), C(9.60) | Al(25.35), Nb(0.03) W(0.02) N(2.89) C(0.08) O(71.64) |
| 11 | 87.1 | 8.0 | 3.8 | 0.8 | 0.0 | 0.3 | 25.0 | 0.5 | Ti(75.18), Nb(0.46) W(0.75), Co(0.04) N(15.69), C(7.88) | Al(24.71), Nb(0.05) W(0.03) N(3.20), C(0.08) O(71.93) |
| 12 | 89.5 | 8.5 | 0.5 | 1.5 | 0.0 | 0.0 | 35.0 | 0.8 | Ti(76.81), Nb(0.10) W(0.45), Co(0.06) N(13.98), C(8.60) | Al(23.15), Nb(0.01) W(0.02), Co(0.01) N(3.81), C(0.18) O(72.82) |

TABLE 4

| | Wear test | | Strong intermittent test | |
|---|---|---|---|---|
| Sample No. | Flank wear (mm) | Edge condition | Number of impacts (Times) | Edge condition |
| 9 | 0.15 | Normal | 1810 | Normal |
| 10 | 0.11 | Normal | 1780 | Normal |
| 11 | 0.09 | Normal | 1800 | Normal |
| 12 | 0.12 | Worn | 1770 | Normal |

As clearly shown in Tables 3 and 4, each of Samples Nos. 9 to 12, whose base 2 is made of a cemented carbide containing 0.1% to 10% by mass of Nb in terms of NbC and covered with a coating formed under specific conditions, included the coating containing Nb with a controlled content and having high adhesion, and exhibited good cutting performance with high wear resistance and fracture resistance.

REFERENCE SIGNS LIST 1 base (cemented carbide)
2 TiN layer
3 TiCN layer
4 intermediate layer
5 Al₂O₃ layer
6 surface layer
7 coating
8 cutting tool

The invention claimed is:

1. A cutting tool, comprising:
a base composed of a cemented carbide;
a TiN layer, on the base, said TiN layer containing Nb;
a TiCN layer on the TiN layer, said TiCN layer containing Nb; and
an Al₂O₃ layer on the TiCN layer, said Al O3 layer containing Nb; wherein
a Nb content of the TiCN layer at a middle thereof in a thickness direction is 0.1% by mass or more, and
the Nb content of the Al₂O₃ layer at a middle thereof in the thickness direction is 0.05% by mass or less.

2. The cutting tool according to claim 1, wherein
a ratio of the Nb content of the base in a vicinity of a surface of the base to the Nb content in an interior of the base is 0.8 or less, and
the Nb content in the interior of the base is 1% to 8% by mass in terms of NbC.

3. The cutting tool according to claim 1, wherein the Nb content at the center of the TiCN layer in the thickness direction is 0.1% to 0.4% by mass.

4. The cutting tool according to claim 1, wherein a concentration distribution of Nb in the TiCN layer has a peak in the thickness direction and has a constant region at an Al₂O₃ layer side of the peak.

5. The cutting tool according to claim 1, wherein the TiN layer has a thickness of 0.3 to 0.6 μm.

6. The cutting tool to claim 1, wherein the cemented carbide base comprises an inner portion having a constant Nb content and a surface portion having a lower Nb content than the inner region, wherein the surface region has a thickness of 5 to 40 μm.

* * * * *

UNITED STATES PATENT AND TRADEMARK OFFICE
CERTIFICATE OF CORRECTION

| | | |
|---|---|---|
| PATENT NO. | : 9,132,484 B2 | Page 1 of 1 |
| APPLICATION NO. | : 14/342305 | |
| DATED | : September 15, 2015 | |
| INVENTOR(S) | : Kou Ri | |

It is certified that error appears in the above-identified patent and that said Letters Patent is hereby corrected as shown below:

In the specification

Column 1, line 26: Please delete the first letters of the line "TIC", and write "TiC" in place thereof.

Column 1, line 28: Please delete "TIC" between the words "as" and "TaC", and write "TiC" in place thereof.

In the claims

Column 10, line 27: Please delete the letters "Al03" between the words "said" and "layer", and write "$Al_2O_3$" in place thereof.

Column 10, line 50: Please write the word "according" between the words "tool" and "to".

Signed and Sealed this
First Day of March, 2016

Michelle K. Lee
*Director of the United States Patent and Trademark Office*